(12) United States Patent
Majerus

(10) Patent No.: US 11,740,814 B2
(45) Date of Patent: Aug. 29, 2023

(54) QUICK ACTIVATE FOR MEMORY SENSING

(71) Applicant: Micron Technology, inc., Boise, ID (US)

(72) Inventor: Kevin T. Majerus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 68 days.

(21) Appl. No.: 17/387,308

(22) Filed: Jul. 28, 2021

(65) Prior Publication Data

US 2022/0011957 A1 Jan. 13, 2022

Related U.S. Application Data

(63) Continuation of application No. 16/686,071, filed on Nov. 15, 2019, now Pat. No. 11,079,949.

(51) Int. Cl.
*G06F 3/00* (2006.01)
*G06F 3/06* (2006.01)
*G11C 11/22* (2006.01)

(52) U.S. Cl.
CPC ............ *G06F 3/0634* (2013.01); *G06F 3/061* (2013.01); *G06F 3/0659* (2013.01); *G06F 3/0673* (2013.01); *G11C 11/221* (2013.01); *G11C 11/2257* (2013.01); *G11C 11/2273* (2013.01)

(58) Field of Classification Search
CPC ... G11C 11/4087; G11C 11/4076; G11C 5/04; G11C 11/4097; G11C 7/1003; G11C 7/1021; G11C 7/1072; G11C 8/12; G11C 7/1045; G11C 7/22; G11C 7/10; G11C 29/023; G11C 29/028; G11C 5/025; G11C 29/32; G11C 5/02; G11C 7/1075; G11C 7/222; G11C 7/225; G11C 11/4096; G11C 2207/107; G11C 2207/2272; G11C 7/1027; G11C 7/1051; G11C 7/1066; G11C 29/1201; G11C 29/14; G06F 13/4295; G06F 13/4022; G06F 13/4282; G06F 15/7807; G06F 3/0605; G06F 3/0659; G06F 3/0683; G06F 13/16; G06F 13/287; G06F 2213/28; G06F 12/0246; G06F 12/0891; G06F 3/0604; G06F 3/0629; G06F 3/0679

See application file for complete search history.

(56) References Cited

U.S. PATENT DOCUMENTS

2017/0316818 A1* 11/2017 Saifuddin ........... G11C 11/4085
2018/0261266 A1 9/2018 Harris et al.

* cited by examiner

*Primary Examiner* — Thong Q Le
(74) *Attorney, Agent, or Firm* — Holland & Hart LLP

(57) ABSTRACT

Methods, systems, and devices for quick activate for memory sensing are described. An operating mode that is associated with a command sequence having a reduced duration relative to another operating mode may be configured at a memory device. The operating mode may be configured based on determining that a testing procedure does not attempt to preserve or is independent of preserving a logic state of accessed memory cells, among other conditions. While operating in the mode, the memory device may perform a received activate command using a first set of operations having a first duration—rather than a second set of operations having a second set of operations having a second, longer duration—to perform the received activate command. The first set of operations may also use less current or introduce less disturbance into the memory device relative to the second set of operations.

18 Claims, 6 Drawing Sheets

QUICK ACTIVATE FOR MEMORY SENSING

CROSS REFERENCE

The present application for patent is a continuation of U.S. patent application Ser. No. 16/686,071 by Majerus, entitled "QUICK ACTIVATE FOR MEMORY SENSING," filed Nov. 15, 2019, assigned to the assignee hereof, and is expressly incorporated by reference in its entirety herein.

BACKGROUND

The following relates generally to a system that includes at least one memory device and more specifically to performing quick activate command sequences.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Before a memory device is deployed, testing procedures may be performed on the memory device to identify flaws and to ensure reliability of the memory device. Testing procedures may also be performed to identify failures of a memory device that may occur while the memory device is deployed.

DETAILED DESCRIPTION

Figure 1:
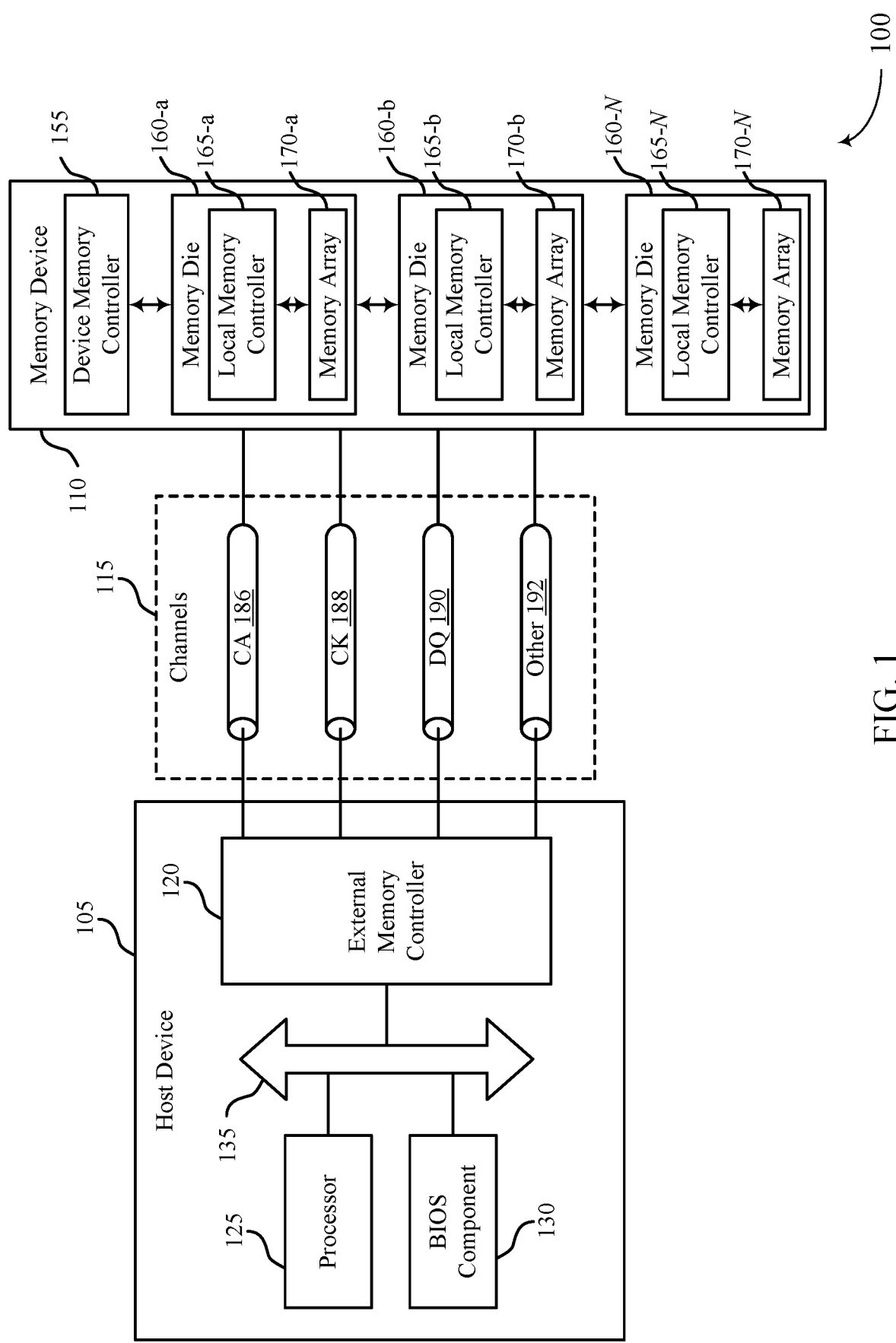
FIG. 1 illustrates an example of a system that supports performing quick activate command sequences as disclosed herein.

Information may be stored in and read from a memory device using access commands that trigger, at the memory device, the performance of a sequence of operations that are used to access (e.g., read from or write to) memory cells addressed by the access commands. In some examples, the sequence of operations for executing the received access commands (or "access command sequence") is different based on a technology used by the memory device. For example, an access command sequence (e.g., an activate (ACT) command sequence) used to access a ferroelectric memory cell may include additional operations and have a longer duration than a corresponding access command sequence (e.g., an ACT command sequence) used to access a dynamic random access memory (DRAM) cell.

In some examples, access commands are also used to implement testing procedures for a memory device. That is, a testing procedure may apply a series of voltages to particular components of a memory device in a particular order by providing a particular series of access commands to the memory device. As the capacity of memory devices has increased, however, a duration of testing procedures has also increased. This increase in testing procedure duration may be exacerbated for memory devices using access commands to implement testing procedures and technologies associated with longer duration access command sequences. In addition to increased testing procedure durations, using access command sequences to implement testing procedures may result in increased current (and thus power) usage and unintentional disturbances that may negatively affect the testing procedure—e.g., when access command sequences cause a memory device to perform unnecessary operations that modify the voltages of one or more memory components.

To reduce testing durations, decrease current draw during testing procedures, and mitigate the negative effects of unintentional disturbance, new access command sequences may be used when a memory device is tested. For example, an ACT command may be executed using a modified set of operations when a testing procedure is performed. In some examples, the ACT command may be performed using a set of operations that omits operations that would otherwise be performed to execute the ACT command—e.g., operations associated with exchanging charge between memory cells and digit lines or sensing a voltage of digit lines to determine logic states stored by corresponding memory cells may be omitted, or both. By omitting certain operations in the modified set operations, a duration of the ACT command sequence may be reduced, an amount of current drawn by the memory device during the ACT command sequence may be reduced, or the amount of disturbance caused by the ACT command sequence may be reduced, or any combination thereof. In some examples, a modified set of operations used to perform an ACT command is referred to as a Quick ACT command sequence, and an unmodified set of operations may be referred to as an ACT command sequence.

In some examples, the Quick ACT command may be used when a testing procedure performed on a memory device is independent of the logic states of the memory cells—e.g., when the testing procedure is not concerned with whether the correct logic states are being read from and written back to the memory cells during the testing procedure. Additionally, or alternatively, the Quick ACT command may be used when a duration of an ACT command sequence exceeds a threshold duration, an amount of current drawn by an ACT command sequence exceeds a threshold current, or an amount of disturbance caused by an ACT command sequence exceeds a threshold amount, or any combination thereof. Additionally, or alternatively, the Quick ACT command sequence may be used to support testing procedures that seek to test a component without accommodating additional voltages that would be applied to or removed from the component during an ACT command sequence.

Features of the disclosure are initially described in the context of memory systems and dies, as described with reference to FIGS. 1 and 2. Features of the disclosure are then described in the context of an exemplary method for performing quick activate command sequences in FIG. 3. These and other features of the disclosure are further illustrated by and described with reference to an apparatus diagram and flowcharts that relate to performing quick activate command sequences in FIGS. 4 through 6.

FIG. 1 illustrates an example of a system 100 that supports performing quick activate command sequences as disclosed herein.

The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the channels 115 may include one or more command and address (CA) channels 186. The CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

A memory device 110 may be tested for reliability or flaws—e.g., before or while the memory device 110 is deployed—among other aspects. In some examples, a testing program being run on a host device 105 may provide a sequence of memory (or access) commands to the memory device 110—e.g., via channels 115—to execute a testing procedure on the memory device 110. In some examples, the memory device 110 may be configured to execute the received access commands using modified access command sequences based on being configured in a particular operating mode (e.g., a test mode). For example, when the memory device 110 is configured in a test mode that ignores the data stored in accessed memory cells, the memory device 110 may perform access command sequences that omit one or more operations that otherwise would be used to execute a received access command. Access command sequences that omit operations may be shorter, use less current, or introduce less disturbance than if the omitted operations were included (or any combination thereof).

Figure 2:
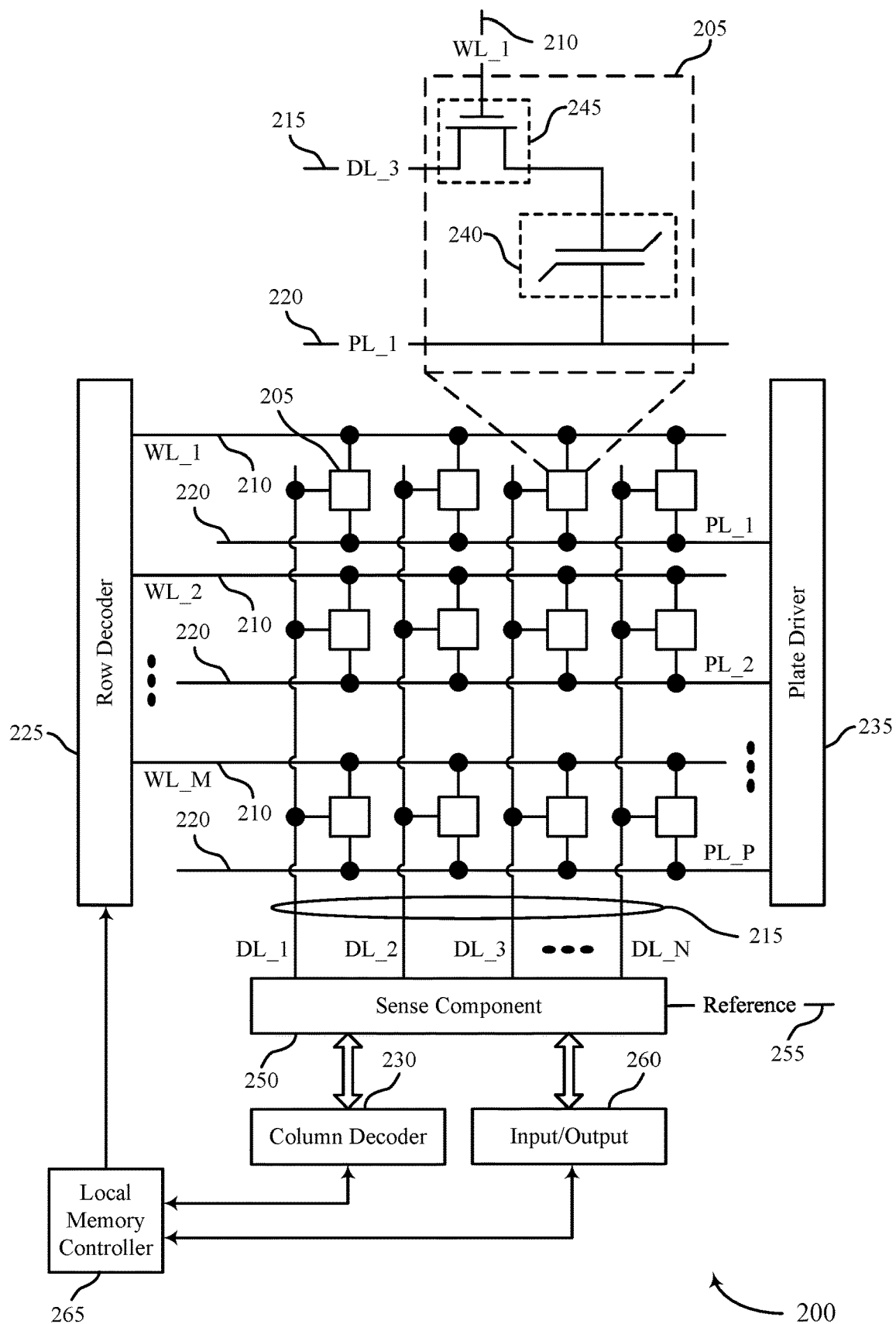
FIG. 2 illustrates an example of a memory die that supports performing quick activate command sequences as disclosed herein.

FIG. 2 illustrates an example of a memory die 200 that supports performing quick activate command sequences as disclosed herein.

The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11).

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference line 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference line 255. Based on that comparison, the sense component 250 may determine a logic state that is stored on the memory cell 205.

Information may be stored in and read from a memory die 200 using access commands that trigger a set of operations (which may also be referred to as a command sequence or access command sequence) to be performed at the memory die 200. In some examples, a signal used to convey an access command includes an indication of a type of access command—e.g., using two bits conveyed in the signal—and an address of memory cells that are targeted by the access command—e.g., using the remaining bits conveyed in the signal to indicate a memory bank, memory section, or memory row, or any combination thereof. Types of access commands may include an activate (ACT) command and a precharge (PRE) command. An ACT command may be used to prepare (or open) an addressed row of memory cells 205 for a subsequent read or write operations. For example, an ACT command may be used to connect all of the memory cells 205 coupled with a word line 210 (e.g., WL_1) to coupled digit lines 215 (e.g., DL_1 through DL_N). In some examples, an ACT command may also be used to sense a logic state of the row of memory cells 205—e.g., by activating a sense component 250 that is coupled with the digit lines 215 after the row of memory cells 205 is connected to the digit lines 215.

A PRE command may be used to close an open row of memory cells 205 before another row of memory cells 205 is opened or accessed or both. In some examples, a PRE command may be used to close a memory section or memory bank that includes a row of memory cells 205 so that a different row of memory cells 205 within the memory section or memory bank may be opened. For example, a PRE command may be used to disconnect a row of memory cells 205 coupled with a word line 210 (e.g., WL_1) from coupled digit lines 215 (e.g., DL_1 through DL_N). In some examples, a PRE command may also be used to write previously sensed logic states—e.g., logic states sensed by sense component 250 during an ACT command-back to the row of memory cells 205. In some examples, an output of the sense component 250 is used to write the previously sensed logic states back to the row of memory cells 205. In some examples, a local memory controller 265 at the memory die 200 may receive access commands from an external device (e.g., a host device). In other examples, access commands may be generated internally by the memory die 200—e.g., the local memory controller 265 may generate the access commands according to a testing program installed on the local memory controller 265 or another component on the memory die 200.

The local memory controller 265 may execute received or generated access commands. To execute an access command, the local memory controller 265 may perform a set of operations (or access command sequence) that corresponds to the access command—e.g., the local memory controller 265 may apply a series of voltages to particular components in a predetermined order. In some examples, a duration for performing an access command sequence used to execute an access command for one technology may be longer than a duration of an access command sequence used to execute the same access command for another technology. For example, an access command sequence used to execute an access command to access memory cells of one technology may include longer timing intervals, or additional operations relative to an access command sequence to execute the same access command to access memory cells of another technology, or both. For instance, performing an access command sequence to execute an ACT command (or an ACT command sequence) that opens a row of ferroelectric memory cells may take longer than performing an ACT command sequence that opens a row of a DRAM cell. Similarly, performing a set of operations to execute a PRE command (or a PRE command sequence) that closes a row of ferroelectric memory cells may take longer than performing a PRE command sequence that closes a row of a DRAM cell.

In some examples, executing an ACT command sequence for one or more ferroelectric memory cells 205 may include a three sets of operations. That is, an ACT command sequence may include a first set of operations associated with connecting the one or more ferroelectric memory cells 205 to one or more digit lines 215. The ACT command sequence may also include a second set of operations associated with exchanging charge between the one or more ferroelectric memory cells 205 with the one or more digit lines 215—e.g., based on a charge stored in the one or more ferroelectric memory cells 205. And the ACT command sequence may include a third set of operations associated with sensing a voltage of the one or more digit lines 215 to determine the logic states stored in the one or more ferroelectric memory cells 205—e.g., based on the charge exchanged between the one or more ferroelectric memory cells 205 and the one or more digit lines 215.

The first set of operations in the ACT command sequence may include activating a memory bank or memory section addressed by the ACT command while a row address included in the ACT command is decoded. After the row address is decoded and the digit lines 215 are precharged, a word line 210 that is coupled with a row of ferroelectric memory cells 205 located at the row address may be identified.

The second set of operations in the ACT command sequence may include precharging digit lines 215 in the memory bank or memory section that are coupled with the row of ferroelectric memory cells 205 addressed by the ACT command. In some examples, the digit lines 215 are precharged concurrently with decoding the row address. In other examples, the digit lines 215 are precharged after decoding the row address. In some examples, precharging the digit lines 215 may include charging the digit lines 215 to a nonzero voltage. In some examples, precharging the digit lines 215 includes applying an additional "boost" voltage to the digit lines 215 after the digit lines 215 are charged to an intermediate voltage—e.g., to finish precharging the digit lines to a sensing voltage. In other examples, precharging the digit lines 215 may include connecting the digit lines 215 to a ground or virtual ground.

After the row address is decoded and the digit lines 215 are precharged, the second set of operations may include activating a word line 210 that is coupled with the row of ferroelectric memory cells 205—e.g., an activation voltage may be applied to the word line 210—causing an access voltage to be applied across the row of ferroelectric memory cells 205. After the word line 210 is activated and the access voltage is applied across the row of ferroelectric memory cells, the second set of operations may include waiting a predetermined duration for a signal to develop on the digit lines 215 as charge is exchanged between the row of ferroelectric memory cells 205 and the digit lines 215. In some examples, a voltage of the digit lines 215 may be maintained at a sensing voltage while the signal is developed, and an amplification capacitor may be used to measure an amount of charge used to maintain the sensing voltage.

The third set of operations in the ACT command sequence may be performed after performing the second set of operations. The third set of operations may include closing gates that isolate (or "isolation gates") a sense component 250 from the digit lines 215, thereby connecting the sense component 250 to the digit lines 215. After connecting the sense component 250 to the digit lines 215, the sense component 250 may be activated to sense logic states stored by the row of ferroelectric memory cells 205 based on the exchange of charge between the row of ferroelectric memory cells 205 and digit lines 215. In some examples, the sensing is based on an amount of charge stored by the amplification capacitor at the end of the signal development waiting period. In some examples, sensing the logic states may include latching the output of the sense component 250 to store the sensed logic states.

After sensing and latching the logic states of the row of ferroelectric memory cells 205, the third set of operations may include removing the applied voltage from across the row of ferroelectric memory cells 205—e.g., zero volts may be applied across the row of ferroelectric memory cells 205—to complete the ACT command sequence. In some examples, when no voltage is applied across a ferroelectric memory cell 205, the ferroelectric memory cell 205 may be referred to as being in a zero disturb state. In some examples, a duration for fully executing the ACT command sequence may extend around 77.5 nanoseconds. In some examples, the word line 210 remains activated after the ACT command sequence is completed. In some examples, removing the voltage from across the row of ferroelectric memory cells 205 may cause a logic state originally stored at a portion of the row of ferroelectric memory cells 205 (e.g., ferroelectric memory cells storing a "0") to be rewritten to the portion of ferroelectric memory cells and an opposite logic state to be stored at another portion of the row of ferroelectric memory cells 205 (e.g., ferroelectric memory cells storing a "1", or vice versa). In some examples, removing the voltage applied across the row of ferroelectric memory cells 205 may include equalizing a voltage of plate line(s) 220 (e.g., PL_1) and the digit lines 215—e.g., by discharging the digit line 215 to a virtual ground.

In some examples, executing a PRE command sequence for one or more ferroelectric memory cells 205 may include two sets of operations. That is, a PRE command sequence may include a first set of operations associated with writing previously sensed logic states back to the one or more ferroelectric memory cells 205. And the PRE command sequence may include a second set of operations associated with disconnecting the one or more ferroelectric memory cells 205 from one or more digit lines 215.

The first set of operations in the PRE command sequence may include closing isolation gates that isolates a sense component 250 from digit lines 215 that are coupled with a row of ferroelectric memory cells 205—e.g., by applying an activation voltage to a transistor coupling the sense component 250 and the digit lines 215. In some examples, during a first interval, a voltage is applied across a ferroelectric memory cell 205 of the row of ferroelectric memory cells 205 after the sense component 250 is coupled with the digit lines 215—e.g., if a latch at the sense component 250 and associated with the ferroelectric memory cell 205 outputs a high voltage and a low voltage is applied to a plate line 220 that is coupled with the ferroelectric memory cell 205.

After closing the isolation gate and during a second interval, the first set of operations may include applying a voltage to the plate line(s) 220. In some examples, a voltage is applied across a ferroelectric memory cell 205 of the row of ferroelectric memory cells 205 after the voltage is applied to the plate line(s) 220—e.g., if the sense component 250 outputs a low voltage and a high voltage is applied to plate line 220 that are coupled with the ferroelectric memory cell 205. In some examples, the output(s) of the sense component 250 is based on a logic state of the row of ferroelectric memory cells 205 sensed during a previous operation—e.g., a logic state sensed in response to an ACT command. By moving a voltage of the plate line(s) 200 from a low to a high voltage, or vice versa, logic states of the row of ferroelectric memory cells 205 that were previously sensed by the sense component 250 may be written back to the row of ferroelectric memory cells 205. Also, by performing the first set of operations, the logic states of the row of ferroelectric memory cells 205 may be restored after a destructive sensing operation.

The second set of operations in the PRE command sequence may be performed after performing the first set of operations. The second set of operations may include equalizing a voltage of the digit lines 215 and the plate line(s) 220 so that no voltage (i.e., OV) is applied across the row of ferroelectric memory cells 205. In some examples, equalizing the voltage of the digit lines 215 and the plate line(s) 220 includes applying a same voltage (e.g., a low, intermediate, or high voltage) to the digit lines 215 and the plate line(s) 220. In some examples, equalizing the voltage of the digit lines 215 and the plate line(s) 220 includes waiting a duration associated with removing charge that is located between bottoms of the row of ferroelectric memory cells 205 and selection components that couple the row of ferroelectric memory cell 205 to the digit lines 215. That is, waiting for the duration may prevent residual charge on the bottom of the ferroelectric memory cell 205 from being trapped when the selection component is deactivated. Once the voltage of the digit line 215 and the plate line(s) 220 has been equalized or the duration has expired (or both), the ferroelectric memory cell 205 may be referred to as being in a zero disturb state.

After equalizing the voltage of the digit lines 215 and plate line(s) 220, the second set of operations may include applying a deactivation voltage to a word line 210 that is coupled with the selection components, which may deactivate the selection components and isolate the row of ferroelectric memory cells 205 from the digit lines 215. The second set of operations may include deactivating the sense component 250 may be deactivated. In some examples, the sense component 250 is deactivated concurrently with deactivating the word line 210. In other examples, the sense component is deactivated after deactivating the word line 210. After the sense component 250 is deactivated, the second set of operations may include equalizing the nodes of the sense component 250 to complete the PRE command sequence. In some examples, the nodes of the sense component 250 may correspond to a first input node that is coupled with the digit line 215 and a second input node that is coupled with a reference line 255. In some examples, a duration for fully executing the PRE command sequence may extend around 80 nanoseconds.

A memory die 200 may be tested to ensure reliability or to identify failures (or both), among other reasons. To test the memory die 200, one or more testing procedures may be performed on the memory die 200. Some testing procedures include margin testing, burn-in testing, reliability testing, qualification testing, and bench characterization testing. Margin testing may include applying specific patterns to components within the memory die 200 while taking timing and voltage measurements of particular components within memory die 200. In some examples, margin testing includes applying patterns that are prone to causing signal interference to components of the memory die 200. Margin testing may be used to identify areas within the memory die 200 that are susceptible to such interference—e.g., by measuring voltages at certain components that exceed a threshold voltage. Burn-in testing may include operating a memory die 200 for an extended period of time under extreme operating conditions (e.g., elevated temperatures and/or voltages). During the initial stage of burn-in testing, less robust components may fail (e.g., broken access lines, memory cells may short, etc.) and, thus, may be identified predeployment. Burn-in testing may be used to cause early failures so that the memory die 200 may be configured to avoid the failed components before the memory die 200 is deployed.

Qualification testing may include operating a memory die 200 within advertised specifications—e.g., by executing command sequences within specified timing parameters. Qualification testing may be used to confirm that the memory die 200 meets advertised specifications. Similarly, bench characterization testing may include operating a memory device within certain parameters—e.g., by executing command sequences within experimental timing parameters. Bench characterization testing may be used to determine specifications for the memory die 200.

In some examples, testing procedures may be executed by providing certain sequences of access commands to a memory die 200—e.g., to apply a specific pattern of voltages to components within the memory die 200. For example, a testing procedure may include applying a series of voltages across or to certain components within the memory die 200 by providing a certain sequence of ACT and PRE commands to a local memory controller 265.

As the capacity of memory devices increases, the duration for completing a testing procedure may also increase—e.g., as more memory cells, traces, sense components, drivers, and the like, are tested. Also, for memory devices that use sequences of access commands to execute a testing procedure, the increased duration of testing procedures associated with high capacity memory devices may be exacerbated for memory devices that use technologies associated with longer access command sequences (e.g., FeRAM memory devices).

Additionally, for memory devices that use sequences of access commands to execute a testing procedure, certain operations performed to execute an access command may unnecessarily draw current and/or disturb other components in the memory device—e.g., when a particular testing procedure does not intend to draw high currents and/or create disturbances.

To avoid excessive costs and duration, techniques for shortening testing procedures may be employed. In some examples, to reduce testing duration and cost, a memory die 200 may be configured to execute an access command sequence using a modified set of operations (e.g., a shortened set of operations) when a testing procedure is performed. Additionally, or alternatively, to avoid unnecessary current draw and disturbance that does not benefit a testing procedure, a memory die 200 may be configured to execute an access command sequence using a modified set of operations (e.g., a set of operations that excludes operations for applying and removing voltages) when the testing procedure is performed.

For example, an ACT command may be executed using a modified set of operations when a testing procedure is performed. For instance, a local memory controller 265 that receives an ACT command targeting (or addressing) a row of memory cells 205 may omit operations in the ACT command sequence associated with exchanging charge between the row of memory cells 205 and corresponding digit lines 215—e.g., to set up a sensing operation. The local memory controller 265 may also omit operations for sensing logic states stored by the row of memory cells 205. Such a command sequence may be referred to as a "Quick ACT command sequence."

In some examples, a Quick ACT command sequence may include two operations. A first operation for activating a memory section that includes the row of memory cells 205 and a subsequent operation for activating a word line 210 coupled with the row of memory cells 205. In some examples, the Quick ACT command sequence may include a third operation for activating a sense component 250 coupled with the row of memory cells 205 that occurs after the word line 210 is activated. In some examples, a duration for fully executing a Quick ACT command sequence may extend around 10 nanoseconds.

Thus, relative to a full ACT command sequence, a Quick ACT command sequence may omit an operation for precharging the digit lines 215 to a precharge voltage; a delay operation allowing charge to be exchanged between the row of memory cells 205 and the digit lines 215; an operation for connecting a sense component 250 to the digit lines 215; an operation for activating the sense component 250; an operation for storing logic states sensed by the sense component 250; and/or an operation for returning the row of memory cells 205 to a zero disturb state—e.g., because the row of memory cells 205 may remain in the zero disturb state through the Quick ACT command sequence. In some examples, a Quick ACT command or series of Quick ACT commands may be used to apply a series of voltage pulses to a word line 210 in quick succession and without disturbing other components coupled with the word line (e.g., the row of memory cells 205). When the Quick ACT command sequence includes the third operation for activating the sense component 250, an ACT command or series of ACT commands may be used to activate and deactivate a sense component 250 in quick succession and without disturbing other components coupled with the sense component 250 (e.g., the row of memory cells 205).

In some examples, a Quick ACT command sequence may be used when a memory die 200 uses a technology associated with a duration for sensing logic states that exceeds a threshold duration—e.g., if an ACT command sequence exceeds 40 nanoseconds. In some examples, a Quick ACT command sequence may be used when a current drawn during a testing procedure exceeds a threshold current—e.g., if one or more ACT commands are used to activate multiple memory section. In some examples, a Quick ACT command sequence may be used when disturbance during a testing procedure exceeds a threshold disturbance—e.g., if a testing procedure intends to make measurements independent of disturbance. Additionally, or alternatively, a Quick ACT command sequence may be used when a particular test is being run—e.g., when a testing procedure that ignores the logic states stored in memory cells 205 is performed.

By using a Quick ACT command sequence, a duration of a testing procedure that uses sequences of commands that include ACT commands may be significantly reduced—e.g., because of the shorter duration of the Quick ACT command sequence. Also, by using a Quick ACT command sequence, an amount of current used during a testing procedure may be reduced—e.g., because of the reduction in the application and removal of voltages to access lines and/or the reduced activation of a sensing component. Additionally, by using a Quick ACT command sequence, unintentional disturbance to other components may be reduced-because of the reduction in the application and removal of voltages to access lines and/or the reduced activation of a sensing component.

In another example, a PRE command may be executed using a modified set of operations when a testing procedure is performed. For instance, a local memory controller 265 that receives a PRE command targeting (or addressing) memory bank(s), memory section(s), and/or row(s) of memory cells 205 may omit operations in the PRE command sequence associated with writing previously sensed logic states back to an open row of memory cells 205. Such a command sequence may be referred to as a "Quick PRE command sequence."

In some examples, a Quick PRE command sequence may include three operations. A first operation for deactivating a word line 210 that is coupled with the row of memory cells 205. A following operation for deactivating a sense component 250 that is coupled with the memory cells 205. And a final operation for equalizing the nodes of the sense component 250 may be equalized. In some examples, Quick PRE command sequence may include four operations. In such cases, the Quick PRE command sequence may begin with equalizing digit lines 215 and plate line(s) 220 coupled with the row of memory cells 205 that occurs before the word line 210 is deactivated. In some examples, a duration for fully executing the Quick PRE command sequence may extend 15 nanoseconds.

Thus, relative to a full PRE command sequence, a Quick PRE command sequence may omit an operation for equalizing digit lines 215 and plate line(s) 220 coupled with the row of memory cells 205; an operation for connecting an activated sense component 250 (or latch associated with the sense component 250) to the digit lines 215; an operation for applying a voltage to the plate line(s) 220 (e.g., a write voltage); a delay operation allowing logic states to be written to the row of memory cells 205; and/or a delay operation allowing charge to be removed from the bottoms of the row of memory cells 205 (e.g., delay operations). In some examples, a Quick PRE command may be used to close a row of memory cells 205 in a reduced duration so that subsequent commands (e.g., an ACT command) may be more quickly processed and allowing additional voltages to be applied to the row of memory cells 205, components associated with the row of memory cells 205, and/or to a different row of memory cells 205.

In some examples, a Quick PRE command sequence may be used when a memory die 200 uses a technology associated with a duration for writing back logic states that exceeds a threshold duration—e.g., if a PRE command sequence exceeds 40 nanoseconds. In some examples, a Quick PRE command sequence may be used when a current drawn during a testing procedure exceeds a threshold current—e.g., if one or more PRE commands are used to close multiple memory section. In some examples, a Quick PRE command sequence may be used when disturbance during a testing procedure exceeds a threshold disturbance—e.g., if a testing procedure intends to make measurements independent of disturbance. Additionally, or alternatively, a Quick PRE command sequence may be used when a particular test is being run—e.g., when a testing procedure that ignores the logic states stored in accessed memory cells 205 is performed.

By using a Quick PRE command sequence, a duration of a testing procedure that uses sequences of commands that include PRE commands may be significantly reduced—e.g., because of the shorter duration of the Quick PRE command sequence. Also, by using a Quick PRE command sequence, an amount of current used during a testing procedure may be reduced—e.g., because of the reduction in the application and removal of voltages to access lines. Additionally, by using a Quick PRE command sequence, unintentional disturbance to other components may be reduced-because of the reduction in the application and removal of voltages to access lines.

In some examples, a Quick ACT command sequence may be used in combination with a Quick PRE command sequence to further decrease a duration of testing procedures. Also, using Quick ACT and Quick PRE command sequences, may enable particular operating modes (e.g., testing modes) to perform a procedure (e.g., a testing procedure) without accommodating certain operations included in ACT and PRE command sequences.

Figure 3:
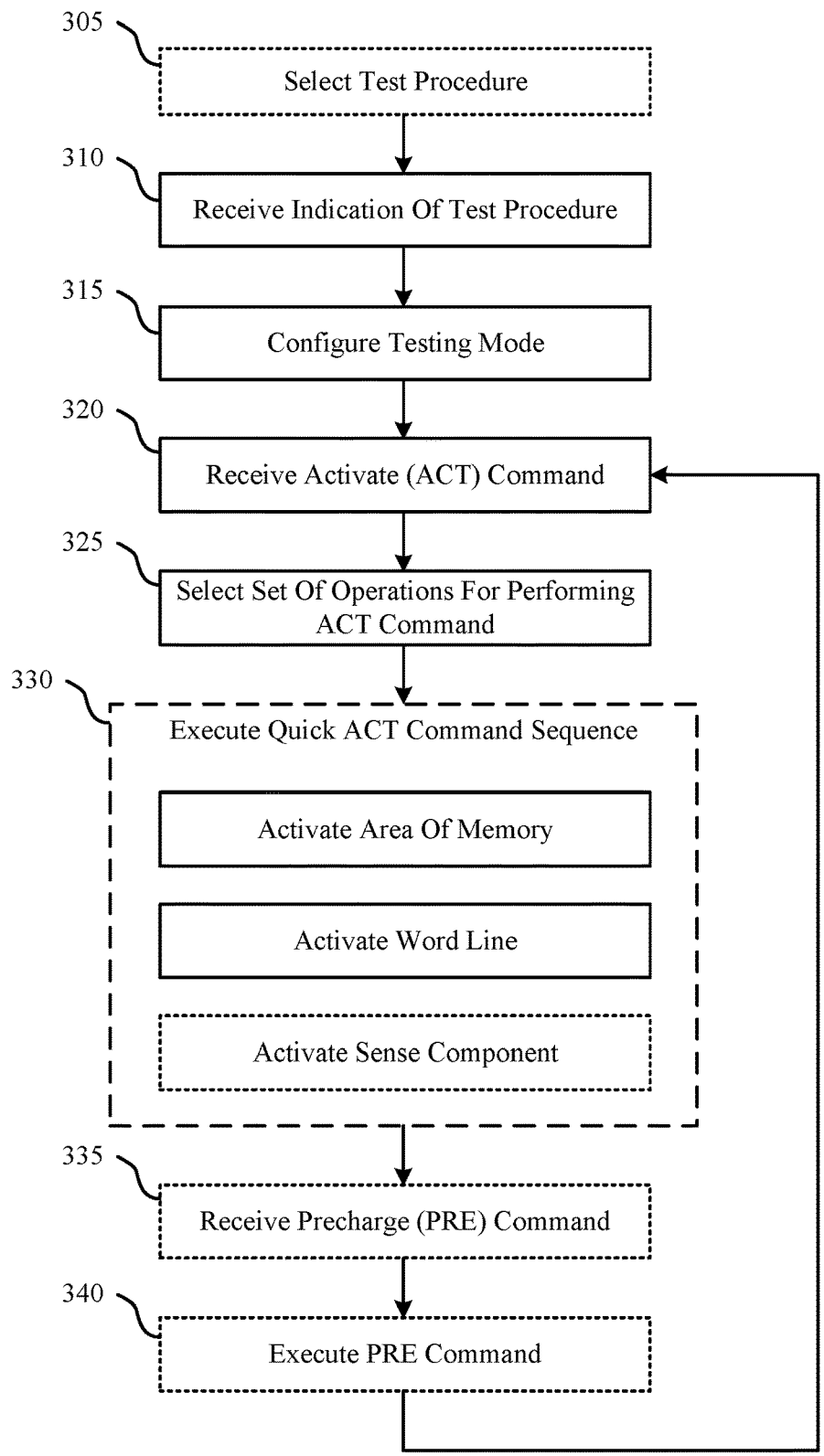
FIG. 3 illustrates an example of a method for performing quick activate command sequences as disclosed herein.

FIG. 3 illustrates an example of a method for performing quick activate command sequences as disclosed herein.

Flow chart 300 illustrates aspects of executing a received ACT command by a memory device using a first set of operations that is associated with a shorter duration, less current draw, and/or less disturbance (which may also be referred to as a Quick ACT command sequence) relative to a second set of operations (which may also be referred to as an ACT command sequence). In some examples, the Quick ACT command sequence may be used when a testing procedure, or portion of the testing procedure, ignores the logic states stored in the memory cells. For such testing procedures, it may be immaterial throughout the testing procedure whether the logic states stored in the memory cells are correctly read, stored, and/or restored after an access operation is performed. Thus, the Quick ACT command sequence may be configured to execute an ACT command within a shortened duration and/or to omit steps associated with reliably writing to or reading from a memory cell.

In some examples, the ACT command sequence may be used when a testing procedure that monitors the logic states stored in the memory cells is performed or when a data access procedure is performed. For such testing and data access procedures, it may be preferred that the logic states stored in the memory cells are correct after an access operation is performed. Thus, the ACT command sequence may be configured to reliably read a logic state from a memory cell, store a logic state into a memory cell, and/or to restore a logic state read from a memory cell.

At block 305, a test procedure may be selected for or by a memory device. In some examples, the test procedure is selected by an engineer—e.g., as a part of predeployment testing or based on an issue identified during operation. In some examples, the test procedure is selected by the memory device—e.g., based on a portion within a larger test program that is loaded on the memory device or based on an issue identified by the memory device during operation. In some examples, the selected testing procedure may be a testing procedure that ignores the logic states stored by memory cells before and after access operations are performed. Testing procedures that ignore logic states may include stress testing, wafer level margin testing, wafer level burn-in testing, wafer level reliability testing, package burn-in testing, unit level reliability testing, qualification testing, and/or characterization testing.

At block 310, the memory device may receive an indication of the selected testing procedure. In some examples, receiving the indication of the selected testing procedure may include receiving an indication of a particular test procedure or type of test procedure that has been selected. In some examples, the indication of the selected testing procedure is received from an external device. In other examples, the indication of the selected testing procedure is received from an internal component that is programmed to run one or a series of test procedures.

Additionally, or alternatively, the memory device may receive an indication to use a particular set of operations to execute received access commands. In some examples, the memory device may receive an indication that a Quick ACT command sequence is to be used. In some examples, the Quick ACT command sequence is used to reduce a duration of a testing procedure—e.g., because the Quick ACT command sequence may omit operations that are otherwise used to execute an ACT command sequence and subsequent operations may be performed more quickly. Similarly, the Quick ACT command sequence may be used to reduce current draw and disturbance to other memory components—e.g., because the Quick ACT command sequence may omit operations that are otherwise used to change a voltage of one or more access lines and/or to activate and deactivate a sense component during an ACT command sequence. The Quick ACT command sequence may also be used to reduce current draw if an ACT command addresses multiple memory banks, memory sections, and/or memory rows or when multiple ACT commands are used to activate multiple memory banks.

In some examples, the Quick ACT command sequence is used to support testing procedures that aim to have sole control over particular memory components. For example, a testing procedure that seeks to control a digit line may use the Quick ACT command sequence when the Quick ACT command sequence omits operations associated with applying or removing a voltage to or from the digit line. Thus, the testing procedure may avoid accounting for the digit line disturbance that would otherwise be caused by applying a voltage to the digit line while executing an ACT command sequence. For example, a testing procedure that applies a voltage to a digit line for a predetermined duration may use a Quick ACT command sequence to prevent an additional voltage from being applied to the digit line when the row of memory cells is opened and before the voltage is applied—e.g., because the additional voltage may defeat the purpose of the testing procedure.

Similarly, the Quick ACT command sequence may be used to support testing procedures that seek to control switching components used to connect a sense component to a digit line and testing procedures that seek to control a plate line. Also, the Quick ACT command sequence may be used to support testing procedures that seek to test a sense component without disturbing coupled memory components. In some examples, the Quick ACT command sequence may also facilitate the application of specific voltage sequences to particular memory components without accounting for voltages that otherwise would be applied while executing an ACT command sequence to close the memory cells. In some examples, a testing procedure that applies a specified sequence of voltages to (e.g., cycles) a plate line or digit line may use a Quick ACT command sequence to prevent an additional voltage from being applied to the plate line or digit line when closing the memory cells. In some examples, a Quick ACT command sequence may be used to discharge a bottom of a memory cell by opening the memory cell to a digit line without applying a voltage to the digit line or a plate line coupled with the memory cell.

In other examples, the memory device may receive an indication that an ACT command sequence is to be used. In some examples, a duration for performing the ACT command sequence may be longer than a duration for performing the Quick ACT command sequence. In some examples, the ACT command sequence may include operations that are included in the Quick ACT command sequence and additional operations. In some examples, the additional operations included in the ACT command sequence may be associated with exchanging charge between a memory cell and digit line or sensing a logic state of the memory cell, or any combination thereof.

At block 315, the memory device may be configured for a test mode corresponding to the selected test procedure. In some examples, the memory device is externally configured for the test mode—e.g., by applying a voltage to a testing pin certain components within the memory device may be activated and/or deactivated to support a corresponding testing mode. In some examples, after being configured for a test mode, the memory device may process received access commands in accordance with the configured test mode.

For example, if activating the testing pin causes a first test mode that is associated with a testing procedure that ignores logic states of memory cells to be configured at the memory device, the memory device may perform the Quick ACT command sequence after receiving an ACT command. In other examples, if activating the testing pin causes a second test mode that retains the logic states of memory cells to be configured at the memory device, the memory device may perform the ACT command sequence after receiving an ACT command.

In some examples, activating the testing pin may cause a first testing component within the memory device and that stores a first set of operations for performing access commands (e.g., that stores a Quick ACT command sequence) to be activated, and/or a second testing component within the memory device and that stores a second set of operations for performing the access command to be deactivated (e.g., that stores an ACT command sequence). In some examples, activating the testing pin may cause a sense component to refrain from performing actions associated with sensing logic states from memory cells or to be disabled entirely.

In other examples, the memory device configures itself for the test mode—e.g., the memory device may activate and deactivate certain components within the memory device based on receiving an indication of the test mode. In some examples, the memory device may configure a testing module to use a first set of operations (or access command sequences, such as a Quick ACT command sequence, a Quick PRE command sequence, etc.) for executing received memory commands after receiving an indication that a test procedure that ignores logic states is to be run. In another example, the memory device may configure a testing module to use the first set of access command sequences for executing received memory commands after receiving an indication that the first set of access command sequences is to be used. In some examples, the indication indicates a particular duration for using the indicated set of operations. In other examples, the memory device is configured to use the indicates set of operations until a contrary indication is received.

In some examples, configuring the testing module to use the first set of access command sequences may include activating a first testing component that stores the first set of access command sequences for performing access commands and/or deactivating a second testing component that stores a second set of operations (or access command sequences, such as an ACT command sequence, a PRE command sequence, etc.) for performing the access commands. In some examples, the memory device may configure a sense component to refrain from performing actions associated sensing logic states from memory cells or may disable the sense component entirely based on receiving the indication of the test procedure.

In other examples, the memory device may configure a testing module to use the second set of access command sequences for executing received memory commands (e.g., an ACT command sequence) after receiving an indication that a test procedure that aims to retain logic states is to be run or an explicit indication that the second set of access command sequences is to be used. In some examples, configuring the testing module to use the second set of access command sequences may include activating the second testing component and/or deactivating the first testing component that stores a first set of access command sequences for performing the access commands.

At block 320, the memory device may receive an ACT command as part of a testing procedure. In some examples, the ACT command is used to open a memory bank, memory section, and/or row of memory cells. Opening a memory cell may include preparing components used to access a memory cell (e.g., word lines, sense components, digit lines, etc.) for a sensing operation (e.g., by precharging a digit line). In some examples, opening a memory cell may also include sensing and/or storing a logic state of the memory cell. In some examples, the ACT command is received from an external device—e.g., a host device that is running a test program and generating commands (including ACT commands) to execute the test program. In some examples, the ACT command is generated within the memory device—e.g., by an embedded testing module that is running a test program. In some examples, the received ACT command includes address information identifying one or more memory cells that are targeted by the received ACT command. For example, the received ACT command may include a memory bank address, a memory section address, and/or a row address associated with one or more memory cells.

In some examples, the ACT command is received (e.g., serially or in parallel) with other access commands that are also used to execute a testing program. In some examples, as part of the testing procedure, the ACT command is received after receiving a PRE command for one or more memory cells and may be used to close the row of memory cells. In some examples, the received ACT command is received after an ACT command—e.g., to open multiple rows of memory cells in a same memory section.

At block 325, the memory device may select a set of operations (or access command sequence) for executing the received ACT command. In some examples, the memory device selects the Quick ACT command sequence as a result of being configured in a first test mode that is associated with the Quick ACT command sequence—that is, the memory device may automatically perform the Quick ACT command sequence based on being previously configured in the first test mode. In other examples, the memory device selects the Quick ACT command sequence after determining that the memory device has been configured in the first test mode. In some examples, the memory device selects the Quick ACT command sequence based on determining that a particular testing procedure or a type of testing procedure is being performed.

In some examples, the Quick ACT command sequence omits operations that are included in the ACT command sequence, such as operations associated with exchanging charge between a memory cell and digit line or sensing a voltage of the digit line to determine a logic state for the memory cell, or both. By omitting operations associated with exchanging charge between a memory cell and digit line and/or sensing a voltage of the digit line, a duration for executing an ACT command may be reduced. The omitted operations may include an operation for precharging digit lines coupled with a row of memory cells—e.g., to prepare for a sensing operation. By omitting the operation associated with precharging the digit lines, a voltage of the digit lines may remain fixed (e.g., at a ground reference) for all or a longer portion of the execution of an ACT command, reducing current drawn and disturbance to other memory components during execution of the ACT command.

The omitted operations may also include a waiting operation that provides a duration for charge to be reliably exchanged between a row of memory cells and precharged digit lines. The omitted operations may also include an operation for connecting a sense component to the digit lines after the waiting duration expires. In some examples, connecting the sense component to the digit lines may include activating isolation gates that couple the sense component to the digit lines. The omitted operation may also include an operation for activating the sense component. In some cases, activating the sense component includes connecting the sense component to a supply voltage source. Additionally, the omitted operations may include an operation for equalizing a voltage of a digit line and plate line—e.g., because the voltage of the digit line and plate line are not changed during the Quick ACT command sequence.

Similarly, by omitting the operations for connecting an output of a sense component to a digit line and a voltage to a plate line, an amount of current drawn during an ACT command that addresses multiple rows of memory cells (e.g., an ACTALL command) may be reduced. In some examples, the amount of current drawn may be reduced below a threshold, which may enable such an ACT command to address an increased quantity of memory rows.

In other examples, the ACT command sequence may be selected—e.g., if the memory device is configured in a second test mode that is associated with the ACT command sequence. In such cases, the memory device may execute a received ACT command by performing an ACT command sequence that includes the omitted operations discussed above.

At block 330, the memory device may execute the received ACT command by performing the Quick ACT command sequence—e.g., based on the first test mode being configured. When performing the Quick ACT command sequence, the memory device may begin by activating a memory bank or memory section addressed in the ACT command. While activating the memory bank or memory section, the memory device may decode a row address included in the ACT command to identify a location of a corresponding row of memory cells as well as a word line for accessing the row of memory cells. Once the memory bank or memory section is activated and the row address is decoded, the memory device may activate the identified word line—e.g., by applying an activation voltage to the word line-which may connect the row of memory cells to corresponding digit lines. In some examples, the Quick ACT command sequence may terminate after activating the word line.

In some examples, when performing the Quick ACT command sequence, the memory device may also activate a sense component after activating the word line. In such cases, the sense component may be tested without disturbing other memory components—e.g., because the isolation gates are not activated. In some examples, the logic states stored by the row of memory cells are not sensed by the memory device at the end of the Quick ACT command sequence.

In some examples, the ACT command may address a full memory bank or memory section (e.g., an ACTALL command), and the memory device may activate all of the word lines included in the memory bank or memory section. In some cases, the memory device may also activate all of the sense components coupled with the memory bank or memory section.

At block 335, the memory device may receive a PRE command as part of the testing procedure. In some examples, the PRE command may close a memory bank, memory section, or row of memory cells. Closing a memory cell may include writing a previously sensed logic state (e.g., a logic state sensed during an ACT operation) back to the memory cell and/or disconnecting the memory cell from a digit line. In some examples, the PRE command may target a row of memory cells opened by the PRE command. In some examples, the PRE command may target all of the rows of memory cells opened in a memory device (e.g., if the PRE command is a PREALL command). In some examples, the PRE command is received from an external device running a testing program or from an internal device that is generating commands for a testing program.

At block 340, the memory device may execute the PRE command. In some examples, executing the PRE command includes performing a PRE command sequence that includes a first set of operations for restoring logic states to memory cells—e.g., by applying an access voltage across the memory cells—and a second set of operations for disconnecting memory cells from digit lines and deactivating memory components coupled with the memory cells. In other examples, executing the PRE command includes performing a Quick PRE command sequence that omits operations associated with restoring logic states to the memory cell—e.g., based on the memory device being configured in the first test mode. Performing received PRE and ACT commands with a Quick PRE command sequence and/or Quick ACT command sequence may decrease a duration associated with a testing procedure relative to using a PRE command sequence and/or ACT command sequence. Additionally, using a Quick PRE command sequence and/or Quick ACT command sequence may decrease current draw and disturbance during testing procedures. In some examples, after completing the Quick PRE command sequence, a logic state may be written back to the memory cell that is different than a logic state that was stored by the memory cell before an immediately prior sensing operation—e.g., before performing the Quick ACT command sequence. In some examples, after completing the Quick PRE command sequence, a soft logic state (e.g., a reduced reliability logic state) may be written back to the memory cell.

In some examples, the memory device may receive another ACT command and may repeat the operations performed at block 320 through block 330. In some examples, the memory device may be reconfigured for a new test mode before receiving the other ACT command. For example, the memory device may be configured for the second test mode. In such cases, the other received ACT command may be executed using an ACT command sequence that includes operations omitted from the Quick ACT command sequence.

Figure 4:
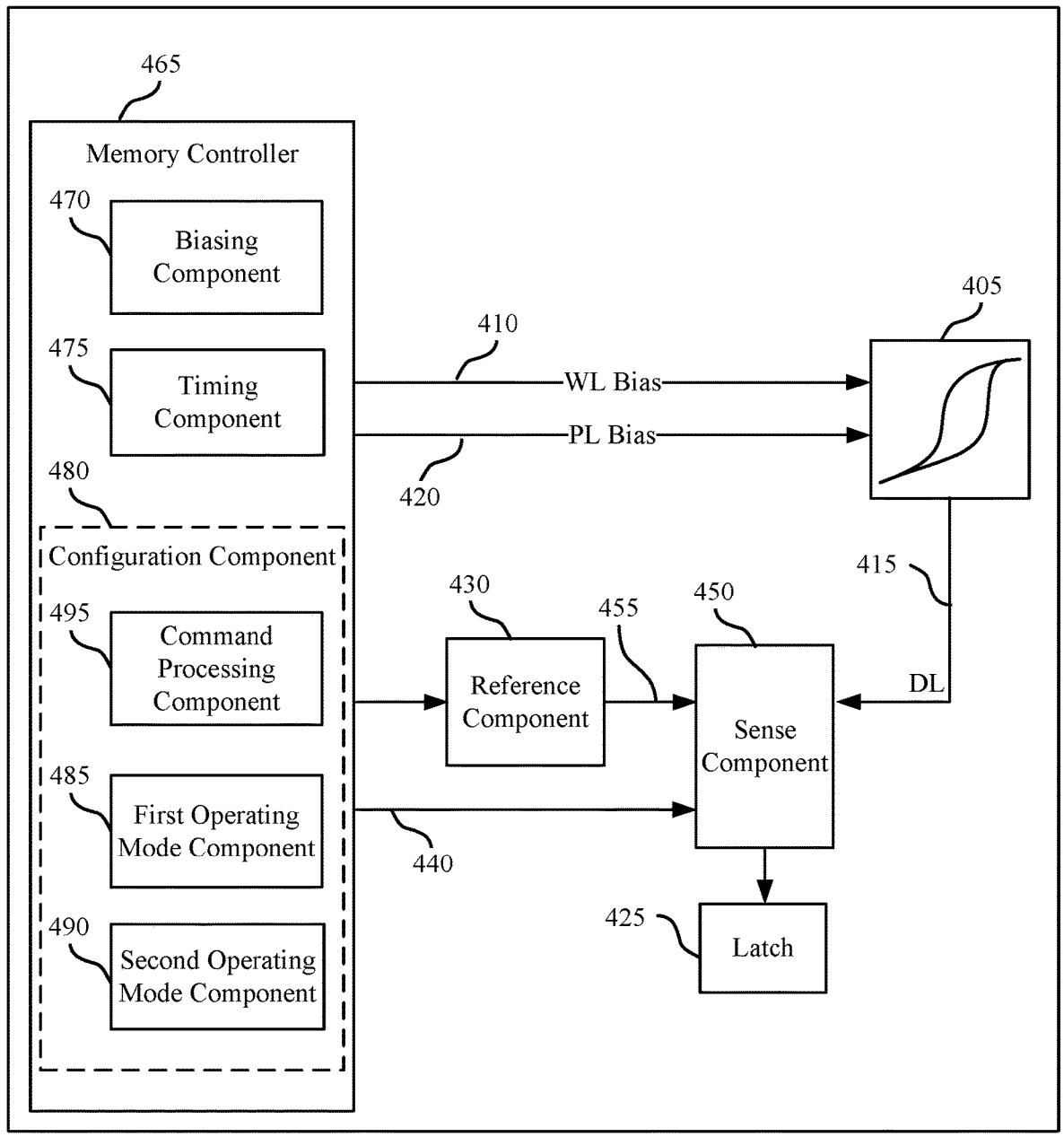
FIG. 4 shows a block diagram of a memory device that supports performing quick activate command sequences as disclosed herein.

FIG. 4 shows a block diagram of a memory device that supports performing quick activate command sequences in accordance with various examples of the present disclosure.

Memory device 400 may be referred to as an electronic memory apparatus and may include memory cell(s) 405, word line 410, digit line 415, plate line 420, sense component 450, reference line 455, and memory controller 465, which may be examples of memory cell(s), a word lines, bit lines, plate lines, sense components, reference lines, and local memory controllers, as described with reference to FIGS. 1 and 2. Memory device 400 may also include latch 425 and reference component 430. The components of memory device 400 may be in electronic communication with each other and may perform the functions described with reference to FIGS. 1 through 3.

Memory cell(s) 405 may be configured to store logic information. In some examples, memory cell(s) 405 may be accessed using one or more access commands that trigger a sequential application of voltages to the components coupled with memory cell(s) 405.

Reference component 430 may include various components to generate a reference signal for sense component 450. Reference component 430 may include circuitry configured to produce a reference signal.

Sense component 450 may compare a signal from memory cell 405 (through digit line 415) with a reference signal from reference component 430. Upon determining the logic state, the sense component may then store the output in latch 425, where it may be used in accordance with the operations of an electronic device that memory device 400 is a part.

Memory controller 465 may, in combination with other components, apply voltages throughout memory device 400, write data to memory cells 405, read data from memory cells 405, and generally operate memory device 400, as described in FIGS. 1 through 3. Memory controller 465 may be in electronic communication with word line 410, digit line 415, plate line 420, reference component 430 sense component 450. Memory controller 465 may include biasing component 470, timing component 475, and configuration component 480. In some examples, memory controller 465 may include a row decoder, column decoder, or both, as described with reference to FIG. 2. This may enable memory controller 465 to access one or more memory cells 405.

In some examples, memory controller 465 may use biasing component 470 to activate access lines by applying voltages to those various nodes. In some examples, biasing component 470 may be configured to apply a voltage to operate memory cell 405 to read or write memory cell 405 as described above. In some examples, biasing component 470 may be configured to provide voltage potentials to reference component 430 in order to generate a reference signal for sense component 450. Additionally, biasing component 470 may provide voltage potentials for the operation of sense component 450.

Timing component 475 may be configured to control the timing of the various word line selections or plate biasing, including timing for switching and voltage application to perform the memory functions, such as reading and writing, discussed herein. In some examples, timing component 475 may control the operations of biasing component 470. In some examples, memory controller 465 may also include reference component 430, sense component 450 and latch 425.

Configuration component 480 may be configured to configure memory device 400 in an operating mode (e.g., a testing mode). For instance, configuration component 480 may configure memory array in a testing mode in which a first set of operations (e.g., a Quick ACT command sequence) are performed to execute a received ACT command or a second set of operations (e.g., an ACT command sequence) associated with a longer duration are performed to execute a received ACT command. Configuration component 480 may include first operating mode component 485, second operating mode component 490, and command processing component 495.

First operating mode component 485 may be configured to store a first set of command sequences for a first set of commands. In some examples, first operating mode component 485 is configured to store a Quick ACT command sequence. In some examples, first operating mode component 485 may be used to execute a received command according to corresponding command sequence of the stored first set of command sequences when memory device 400 is configured in a first test mode—e.g., first operating mode component 485 may execute a Quick ACT command sequence after an ACT command is received at memory controller 465.

Second operating mode component 490 may be configured to store a second set of command sequences for a second set of commands. In some examples, one or more of the second set of command sequences have longer durations than a corresponding command sequence of the first set of command sequences. In some examples, second operating mode component 490 is configured to store an ACT command sequence. In some examples, second operating mode component 490 may be used to execute a received command according to a corresponding command sequence of the stored second set of command sequences when memory device 400 is configured in a second test mode or in a data access mode—e.g., second operating mode component 490 may execute an ACT command sequence after an ACT command is received at memory controller 465.

Command processing component 495 may be configured to receive access commands—e.g., received from an external device or another component of memory controller 465. In some examples, command processing component 495 may be configured to buffer the received access command and relay the access commands to other components within memory controller 465, such as first operating mode component 485 and second operating mode component 490. In some examples, command processing component 495 may be configured to generate access commands—e.g., based on a testing program installed at memory controller 465.

In some examples, memory controller 465 may be configured to operate in a first mode (e.g., a first test mode) that is associated with shorter command sequences than a second mode (e.g., a second test mode). Memory controller 465 may be further configured to perform a first set of operations associated with the first testing mode (e.g., a Quick ACT command sequence) to execute a first access command (e.g., an ACT command) when configured in the first test mode or a second set of operations (e.g., a Quick ACT command sequence) associated with the second testing mode to execute the first access command when configured in the second test mode. In some examples, memory controller 465 may perform the first set of operations in a shorter duration than the second set of operations. In some examples, memory controller 465 may use configuration component 480 to identify a testing mode requested by an external device. Memory controller 465 may also use configuration component 480 to configure memory device 400 for the identified testing mode (e.g., either the first or second testing mode). In some examples, memory controller 465 uses configuration component 480 to configure sense component 450 to refrain from sensing a logic state from a memory cell after being configured for the first mode.

In some examples, memory controller 465 may receive and process access commands. In some examples, memory controller 465 uses first operating mode component 485 to process access commands when a first testing procedure is performed. When first operating mode component 485 is activated, memory controller 465 may perform a Quick ACT command sequence after receiving an ACT command. To perform a Quick ACT command sequence, as an initial step, first operating mode component 485 may use biasing component 470 to activate a memory bank or memory section. Next, first operating mode component 485 may use biasing component 470 to apply an activation voltage to word line 410. In some examples, first operating mode component 485 may also send a signal (e.g., via control line 440) to activate sense component 450. In some examples, the signal is used to connect the sense component 450 to a voltage source.

Figure 5:
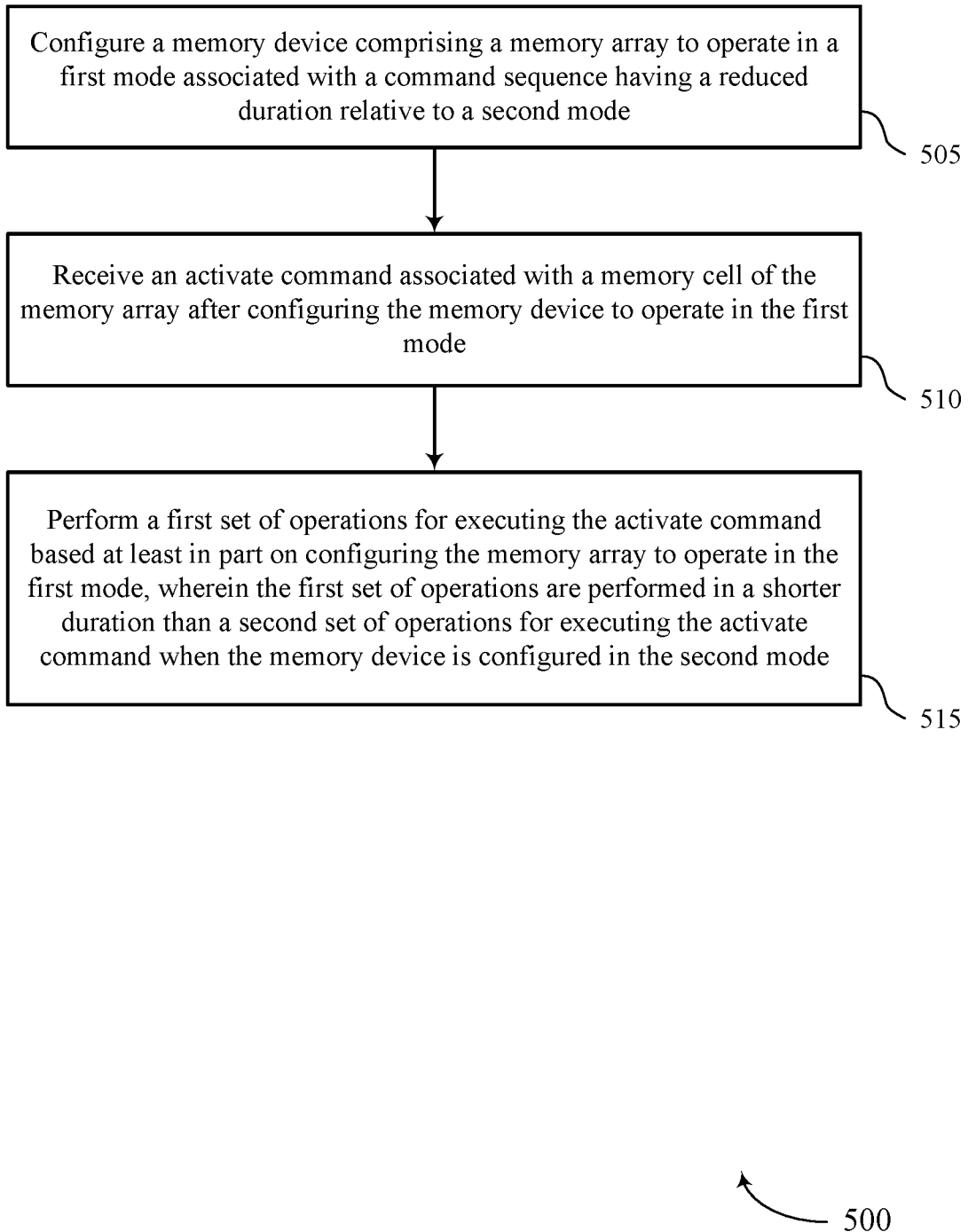
FIGS. 5 and 6 show flowcharts illustrating a method or methods that support performing quick activate command sequences as disclosed herein.

FIG. 5 shows a flowchart illustrating a method or methods 500 that supports quick activate for memory sensing in accordance with aspects of the present disclosure. The operations of method 500 may be implemented by a memory array or its components as described herein. For example, the operations of method 500 may be performed by a memory array as described with reference to FIG. 4. In some examples, a memory array may execute a set of instructions to control the functional elements of the memory array to perform the described functions. Additionally, or alternatively, a memory array may perform aspects of the described functions using special-purpose hardware.

At 505, the memory array may configure a memory device including a memory array to operate in a first test mode associated with a command sequence having a reduced duration relative to a second mode. The operations of 505 may be performed according to the methods described herein. In some examples, aspects of the operations of 505 may be performed by a configuration component as described with reference to FIG. 4.

At 510, the memory array may receive an activate command associated with a memory cell of the memory array after configuring the memory device to operate in the first mode. The operations of 510 may be performed according to the methods described herein. In some examples, aspects of the operations of 510 may be performed by a command processing component as described with reference to FIG. 4.

At 515, the memory array may perform a first set of operations for executing the activate command based on configuring the memory array to operate in the first mode, where the first set of operations are performed in a shorter duration than a second set of operations for executing the activate command when the memory device is configured in the second mode. The operations of 515 may be performed according to the methods described herein. In some examples, aspects of the operations of 515 may be performed by a first operating mode component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for configuring a memory device including a memory array to operate in a first mode associated with a command sequence having a reduced duration relative to a second mode, receiving an activate command associated with a memory cell of the memory array after configuring the memory device to operate in the first mode, and performing a first set of operations for executing the activate command based on configuring the memory array to operate in the first mode, where the first set of operations are performed in a shorter duration than a second set of operations for executing the activate command when the memory device is configured in the second mode.

Some examples of the method 500 and the apparatus described herein may further include operations, features, means, or instructions for selecting the first set of operations for executing the activate command instead of the second set of operations based on configuring the memory array to operate in the first mode.

In some examples of the method 500 and the apparatus described herein, performing the first set of operations may include operations, features, means, or instructions for activating, as a first operation of the first set of operations, a memory section in the memory array that includes the memory cell, and activating, as a second operation of the first set of operations that occurs after the first operation, a word line that may be coupled with the memory cell, where a change in a voltage of a digit line that may be coupled with the memory cell remains below a threshold after activating the word line.

Some examples of the method 500 and the apparatus described herein may further include operations, features, means, or instructions for charging stored at a bottom of the memory cell may be released to the digit line based on activating the word line.

In some examples of the method 500 and the apparatus described herein, performing the first set of operations may include operations, features, means, or instructions for activating, as a third operation of the first set of operations that occurs after the second operation, a sense component that may be coupled with the memory cell, where the sense component may be activated without applying a voltage across the memory cell.

In some examples of the method 500 and the apparatus described herein, performing the first set of operations may include operations, features, means, or instructions for refraining from sensing a logic state of the memory cell.

Some examples of the method 500 and the apparatus described herein may further include operations, features, means, or instructions for executing a precharge command associated with the memory cell after executing the activate command, where executing the precharge command includes refraining from writing the logic state back to the memory cell based on refraining from sensing the logic state.

In some examples of the method 500 and the apparatus described herein, the memory cell stores the logic state before receiving the precharge command and stores a different logic state after executing the precharge command.

Some examples of the method 500 and the apparatus described herein may further include operations, features, means, or instructions for configuring the memory device to operate in the second mode, receiving a second activate command associated with the memory cell after configuring the memory device to operate in the second mode, and performing the second set of operations to execute the second activate command based on configuring the memory array to operate in the second mode.

In some examples of the method 500 and the apparatus described herein, performing the second set of operations may include operations, features, means, or instructions for activating a memory section in the memory array that includes the memory cell, precharging a digit line that may be coupled with the memory cell after activating the memory section, activating a word line that may be coupled with a selection component after precharging the digit line, where a change in a voltage of the digit line exceeds a threshold after activating the word line, and where the selection component may be coupled with the memory cell, waiting a duration associated with exchanging charge between the memory cell and the digit line based on activating the word line, coupling an input of a sense component to the digit line after waiting the duration, activating the sense component after coupling the input of the sense component to the digit line, and applying a zero voltage across the memory cell based on activating the sense component.

In some examples of the method 500 and the apparatus described herein, the activate command may be associated with a set of memory cells that include the memory cell, and where the first set of operations may be performed for the set of memory cells.

In some examples of the method 500 and the apparatus described herein, the memory array includes one or more ferroelectric memory cells, and where the memory cell may be a ferroelectric memory cell.

In some examples of the method 500 and the apparatus described herein, the first mode may be associated with one or more of wafer level margin testing, wafer level burn-in testing, wafer level reliability testing, package burn-in testing, unit level reliability testing, qualification testing, or bench characterization testing.

Some examples of the method 500 and the apparatus described herein may further include operations, features, means, or instructions for performing the first set of operations associated with operating the second memory cell, where a level of current for executing the activate command remains below a threshold based on the first mode being configured.

In some examples of the method 500 and the apparatus described herein, the first mode may be a first test mode and the second mode may be a second test mode.

Figure 6:
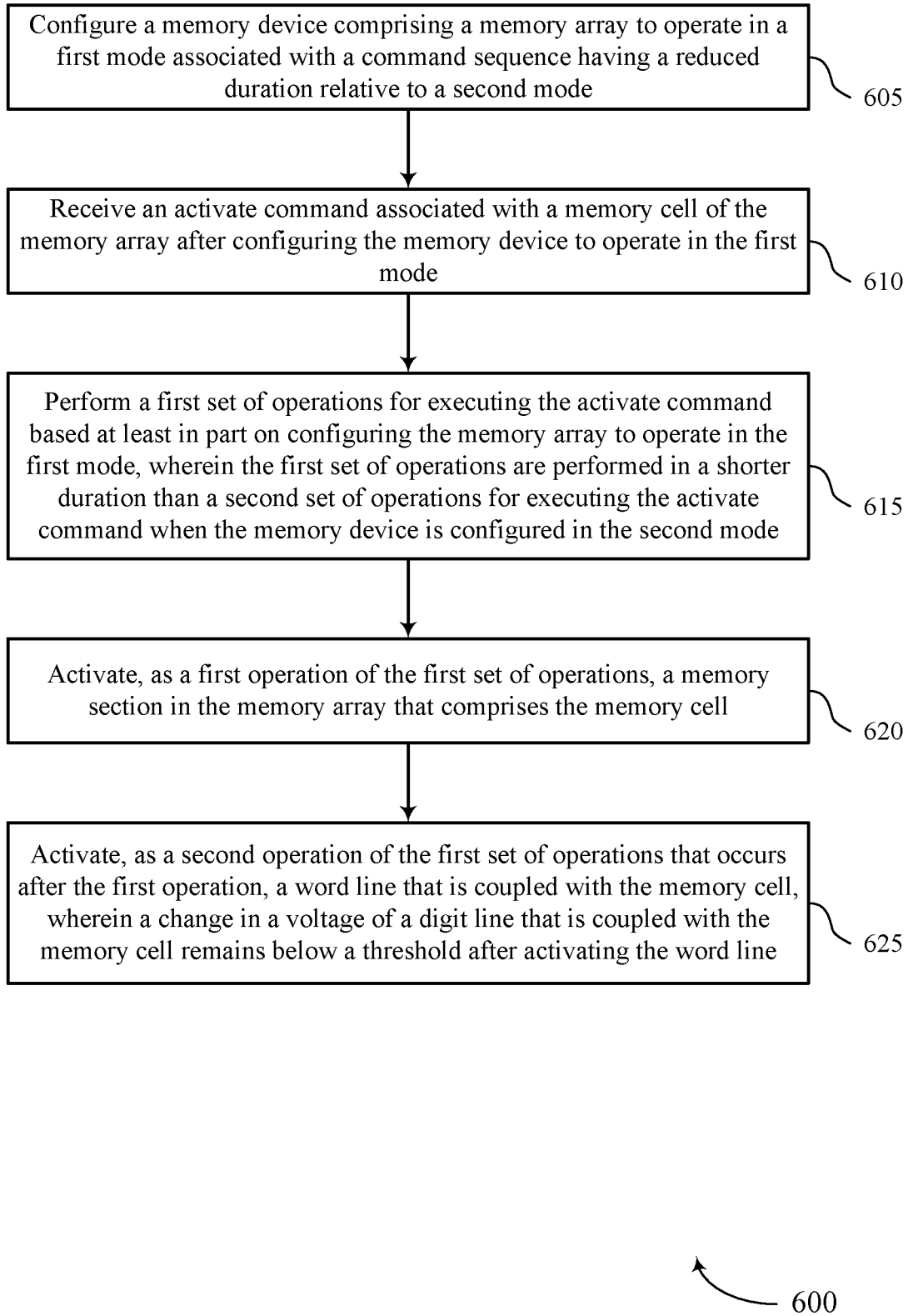

FIG. 6 shows a flowchart illustrating a method or methods 600 that supports quick activate for memory sensing in accordance with aspects of the present disclosure. The operations of method 600 may be implemented by a memory array or its components as described herein. For example, the operations of method 600 may be performed by a memory array as described with reference to FIG. 4. In some examples, a memory array may execute a set of instructions to control the functional elements of the memory array to perform the described functions. Additionally, or alternatively, a memory array may perform aspects of the described functions using special-purpose hardware.

At 605, the memory array may configure a memory device including a memory array to operate in a first mode associated with a command sequence having a reduced duration relative to a second mode. The operations of 605 may be performed according to the methods described herein. In some examples, aspects of the operations of 605 may be performed by a configuration component as described with reference to FIG. 4.

At 610, the memory array may receive an activate command associated with a memory cell of the memory array after configuring the memory device to operate in the first mode. The operations of 610 may be performed according to the methods described herein. In some examples, aspects of the operations of 610 may be performed by a command processing component as described with reference to FIG. 4.

At 615, the memory array may perform a first set of operations for executing the activate command based on configuring the memory array to operate in the first mode, where the first set of operations are performed in a shorter duration than a second set of operations for executing the activate command when the memory device is configured in the second mode. The operations of 615 may be performed according to the methods described herein. In some examples, aspects of the operations of 615 may be performed by a first operating mode component as described with reference to FIG. 4.

At 620, the memory array may activate, as a first operation of the first set of operations, a memory section in the memory array that includes the memory cell. The operations of 620 may be performed according to the methods described herein. In some examples, aspects of the operations of 620 may be performed by a first operating mode component (e.g., in combination with a biasing component) as described with reference to FIG. 4.

At 625, the memory array may activate, as a second operation of the first set of operations that occurs after the first operation, a word line that is coupled with the memory cell, where a change in a voltage of a digit line that is coupled with the memory cell remains below a threshold after activating the word line. The operations of 625 may be performed according to the methods described herein. In some examples, aspects of the operations of 625 may be performed by a first operating mode component (e.g., in combination with a biasing component) as described with reference to FIG. 4.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell and a memory controller coupled with the memory cell and configurable to operate in a first mode associated with an activate sequence having a reduced duration relative to a second mode, the memory controller operable to perform a first set of operations associated with the first mode to execute an activate command when configured in the first mode or a second set of operations associated with the second mode to execute the activate command for accessing the memory cell when configured in the second mode, where a duration for performing the first set of operations is shorter than a duration for performing the second set of operations.

In some examples, the memory controller may include operations, features, means, or instructions for a configuration component operable to identify a testing mode requested by an external device and to configure the apparatus for the identified testing mode, the testing mode including the first mode or the second mode.

In some examples, the configuration component may be operable to select the first set of operations or the second set of operations based on the identified testing mode.

In some examples, the memory controller may include operations, features, means, or instructions for a first mode component operable to store a first command sequence corresponding to the activate command, and a second mode component operable to store a second command sequence corresponding to the activate command, where the first command sequence may be performable in a shorter period of time than the second command sequence.

Some examples of the apparatus may include a sense component coupled with the memory cell and operable to refrain from sensing a logic state from the memory cell during execution of the activate command when the first mode may be configured.

An apparatus is described. The apparatus may include a memory array including a memory cell and a memory controller that is coupled with the memory array, the memory controller operable to configure a first mode associated with one or more command sequences having a reduced duration relative to a second mode, receive an activate command associated with the memory cell after configuring the first mode, and perform a first set of operations for executing the activate command based on configuring the memory array to operate in the first mode, where the first set of operations are performed in a shorter duration than a second set of operations for executing the activate command when the second mode is configured.

Some examples may further include selecting the first set of operations for executing the activate command instead of the second set of operations based on configuring the memory array to operate in the first mode.

Some examples may further include activating, as the initial operation of the first set of operations, a memory section in the memory array that includes the memory cell, and activate, as the next operation of the first set of operations, a word line that may be coupled with the memory cell after activating the memory section.

Some examples may further include activating a sense component that may be coupled with the memory cell after activating the word line.

Some examples may further include executing a precharge command after activating the word line and without sensing a logic state of the memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   determining that activate commands are to be performed using a first sequence that is associated with a reduced duration relative to a second sequence for executing activate commands;
   receiving an activate command associated with a memory cell based at least in part on the determining; and
   performing, on the memory cell, a set of operations of the first sequence based at least in part on the activate command, wherein performing the set of operations comprises:
      activating a word line that is coupled with the memory cell, wherein a change in a voltage of a digit line that is coupled with the memory cell remains below a threshold after activating the word line.

2. A method comprising:
   determining that activate commands are to be performed using a first sequence that is associated with a reduced duration relative to a second sequence for executing activate commands;
   receiving an activate command associated with a memory cell based at least in part on the determining;
   performing, on the memory cell, a set of operations of the first sequence based at least in part on the activate command; and
   configuring a testing component to execute activate commands using the first sequence based at least in part on the determining.

3. The method of claim 2, further comprising:
   indicating, based at least in part on the configuring, a duration for the testing component to execute activate commands using the first sequence, wherein the testing component executes activate commands using the second sequence after an end of the duration.

4. The method of claim 1, further comprising:
   activating, based at least in part on the determining, a first testing component for executing activate commands using the first sequence;
   deactivating, based at least in part on the determining, a second testing component for executing activate commands using the second sequence; and
   providing the activate command to the first testing component based at least in part on the activating and deactivating.

5. A method comprising:
   determining that activate commands are to be performed using a first sequence that is associated with a reduced duration relative to a second sequence for executing activate commands;
   receiving an activate command associated with a memory cell based at least in part on the determining;
   performing, on the memory cell, a set of operations of the first sequence based at least in part on the activate command; and
   disabling a sense component based at least in part on the determining.

6. The method of claim 1, further comprising:
   detecting that a voltage of a pin is at a level, wherein determining that activate commands are to be performed using the first sequence is based at least in part on the pin being at the level;
   detecting, after performing the set of operations, that the voltage of the pin is at a second level;
   determining that activate commands are to be performed using the second sequence based at least in part on the pin being at the second level;
   receiving a second activate command associated with the memory cell based at least in part on determined that activate commands are to be performed using the second sequence; and performing, on the memory cell, a set of operations of the second sequence based at least in part on the second activate command.

7. The method of claim 1, further comprising:
determining that a testing mode has been configured, wherein determining that activate commands are to be performed using the first sequence is based at least in part on the testing mode being initiated; and
determining, based at least in part on the testing mode being configured, that a testing program is initiated, wherein determining that activate commands are to be performed using the first sequence is based at least in part on the testing program being initiated.

8. The method of claim 7, further comprising:
determining, after executing the testing program, that a second testing program is initiated; and
determining that activate commands are to be performed using the second sequence based at least in part on the second testing program being initiated.

9. The method of claim 7, wherein the testing program is performed independent of logic states of memory cells accessed by the testing program, the memory cells comprising the memory cell, and the testing program comprising one or more of a stress testing program, a wafer-level margin testing program, a wafer-level burn-in testing program, a wafer-level reliability testing program, a package burn-in testing program, a unit-level reliability testing program, a qualification testing program, or a bench characterization testing program.

10. The method of claim 7, further comprising:
determining, after the testing mode is configured, that an operating mode is configured; and
determining that activate commands are to be performed using the second sequence based at least in part on the operating mode being configured.

11. A method, comprising:
determining that activate commands are to be performed using a first sequence that is associated with a reduced duration relative to a second sequence for executing activate commands;
receiving an activate command associated with a memory cell based at least in part on the determining; and
performing, on the memory cell, a set of operations of the first sequence based at least in part on the activate command, wherein performing the set of operations comprises:
maintaining an output of a sense component isolated from a digit line coupled with the memory cell.

12. A method, comprising:
receiving an activate command associated with a plurality of memory sections of a memory array;
performing a set of operations for executing the activate command, wherein the set of operations are associated with accessing memory cells in the plurality of memory sections, and wherein a level of current for executing the activate command remains below a threshold based at least in part on the set of operations being performed; and
applying a voltage to a first word line in a first memory section of the plurality of memory sections and to a second word line in a second memory section of the plurality of memory sections.

13. The method of claim 12, wherein the set of operations are performed based at least in part on a first mode being configured, the set of operations being performed in a shorter duration than a second set of operations for executing the activate command when a second mode is configured.

14. The method of claim 12, further comprising:
maintaining, based at least in part on performing the set of operations, an output of a first sense component isolated from a first digit line coupled with a first memory cell in a first memory section of the plurality of memory sections and an output of a second sense component isolated from a second digit line coupled with a second memory cell in a second memory section of the plurality of memory sections.

15. The method of claim 12, further comprising:
maintaining, based at least in part on performing the set of operations, a voltage of a first plate line in a first memory section of the plurality of memory sections at a virtual ground and a second plate in a second memory section of the plurality of memory sections at the virtual ground.

16. An apparatus, comprising:
a memory array; and
a controller coupled with the memory array and configured to cause the apparatus to:
determine that activate commands are to be performed using a first sequence that is associated with a reduced duration relative to a second sequence for executing activate commands;
receive an activate command associated with a memory cell of the memory array based at least in part on the determining; and
perform a set of operations of the first sequence based at least in part on the activate command, wherein to perform the set of operations, the controller is further configured to cause the apparatus to:
activate a word line that is coupled with the memory cell, wherein a change in a voltage of a digit line that is coupled with the memory cell remains below a threshold after activating the word line.

17. The apparatus of claim 16, wherein the controller is further configured to cause the apparatus to:
configure a testing component to execute activate commands using the first sequence based at least in part on the determining.

18. The apparatus of claim 16, wherein the controller is further configured to cause the apparatus to:
activate, based at least in part on the determining, a first testing component for executing activate commands using the first sequence;
deactivate, based at least in part on the determining, a second testing component for executing activate commands using the second sequence; and
provide the activate command to the first testing component based at least in part on the activating and deactivating.

* * * * *